United States Patent
Culp et al.

(10) Patent No.: US 8,470,713 B2
(45) Date of Patent: Jun. 25, 2013

(54) NITRIDE ETCH FOR IMPROVED SPACER UNIFORMITY

(75) Inventors: James A. Culp, Newburgh, NY (US);
John J. Ellis-Monaghan, Grand Isle, VT (US); Jeffrey P. Gambino, Westford, VT (US); Kirk D. Peterson, Jericho, VT (US); Jed H. Rankin, Richmond, VT (US); Christa R. Willets, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 12/966,432

(22) Filed: Dec. 13, 2010

(65) Prior Publication Data

US 2012/0149200 A1    Jun. 14, 2012

(51) Int. Cl.
*H01L 21/311* (2006.01)

(52) U.S. Cl.
USPC .................................. 438/695; 257/E21.249

(58) Field of Classification Search
USPC .................................. 438/696, 424, 791, 197
See application file for complete search history.

(56) References Cited

U.S. PATENT DOCUMENTS

| | | | |
|---|---|---|---|
| 6,884,670 B2 | 4/2005 | Hashimoto et al. | |
| 7,311,852 B2 | 12/2007 | Li et al. | |
| 2002/0048971 A1* | 4/2002 | Sato et al. | 438/791 |
| 2003/0045113 A1 | 3/2003 | Enomoto et al. | |
| 2004/0014305 A1 | 1/2004 | Haselden et al. | |
| 2004/0063260 A1* | 4/2004 | Bu et al. | 438/197 |
| 2004/0175955 A1 | 9/2004 | Haselden et al. | |
| 2006/0051964 A1 | 3/2006 | Xia et al. | |
| 2010/0257726 A1* | 10/2010 | Furuta et al. | 29/610.1 |

OTHER PUBLICATIONS

Wolf and R.N. Tauber, (Silicon Processing for the VLSI Era, vol. 1—Process Technology, Lattice Press, 1986)(pp. 542-557).*
B.E.E. Kastenmeier et al., "Chemical dry etching of silicon nitride and silicon dioxide using $CF_4/O_2/N_2$ gas mixtures", J. Vac. Sci. Technol. A 14(5), pp. 2802-2813, Sep./Oct. 1996.

* cited by examiner

*Primary Examiner* — Nadine Norton
*Assistant Examiner* — Mahmoud Dahimene
(74) *Attorney, Agent, or Firm* — Scully, Scott, Murphy & Presser, P.C.; Richard M. Kotulak, Esq.

(57) ABSTRACT

A method of forming dielectric spacers including providing a substrate comprising a first region having a first plurality of gate structures and a second region having a second plurality of gate structures and at least one oxide containing material or a carbon containing material. Forming a nitride containing layer over the first region having a thickness that is less than the thickness of the nitride containing layer that is present in the second region. Forming dielectric spacers from the nitride containing layer on the first plurality the second plurality of gate structures. The at least one oxide containing material or carbon containing material accelerates etching in the second region so that the thickness of the dielectric spacers in the first region is substantially equal to the thickness of the dielectric spacers in the second region of the substrate.

20 Claims, 2 Drawing Sheets

NITRIDE ETCH FOR IMPROVED SPACER UNIFORMITY

BACKGROUND

The present disclosure relates to semiconductor structures and devices. More particularly, the present disclosure relates to etch processes employed in the manufacture of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Etch processes are continually being modified to meet the demands for increased scaling of semiconductor devices.

SUMMARY

A method of forming dielectric gate sidewall spacers is provided, in which the etch rate of the nitride material layers that provides the dielectric gate sidewall spacers is adjusted by controlling the amount oxide that is present during the etch process that forms the dielectric gate sidewall spacers. In one embodiment, the method of forming the dielectric spacers includes providing a substrate comprising a first region having a first plurality of gate structures and a second region having a second plurality of gate structures and at least one oxide containing material. The first plurality of gate structures in the first region of the substrate are present in a greater density than the second plurality of gate structures in the second region of the substrate.

A layer of a nitride containing material is formed over the first region and the second region of the substrate. The layer of the nitride containing material has a first thickness over the first region of the substrate that is less than a second thickness of the layer of the nitride containing material that is present over the second region of the substrate. Openings are formed through the layer of the nitride containing material to expose a portion of the at least one oxide containing material. Dielectric spacers are formed from a remaining portion of the layer of the nitride containing material on the first plurality of gate structures and the second plurality of gate structures. The at least one oxide containing material accelerates etching in the second region of the substrate so that the thickness of the dielectric spacers in the first region of the substrate are substantially equal to the thickness of the dielectric spacers in the second region of the substrate.

In a further embodiment, a method of forming dielectric spacers is provided that may include providing a substrate comprising a first region having a first plurality of gate structures and a second region having a second plurality of gate structures and at least one carbon containing material. The first plurality of gate structures in the first region of the substrate are present in a greater density than the second plurality of gate structures in the second region of the substrate. A layer of a nitride containing material is formed over the first region and the second region of the substrate. The layer of the nitride containing material has a first thickness over the first region that is less than a second thickness of the layer of the nitride containing material that is present in the second region of the substrate. Openings are formed through the layer of the nitride containing material to expose a portion of the at least one carbon containing material. Dielectric spacers are formed from a remaining portion of the layer of the nitride containing material on the first plurality of gate structures and the second plurality of gate structures. The at least one carbon containing material accelerates etching in the second region of the substrate so that the thickness of the dielectric spacers in the first region of the substrate is substantially equal to the thickness of the dielectric spacers in the second region of the substrate.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The teem "direct contact" means that a first element, such as a first structure, and a second element, such as a second structure, are connected without any intermediary conducting, insulating or semiconductor layers at the interface of the two elements.

The present disclosure relates to forming dielectric spacers to the sidewall of the gate structures to semiconductor devices. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor. In some of the embodiments, the semiconductor device is a field effect transistor (FET). A field effect transistor (FET) is a semiconductor device in which output current, i.e., source-drain current, is controlled by the voltage applied to a gate structure. A field effect transistor (FET) has three terminals, i.e., a gate structure, a source and a drain region. The gate structure is a structure used to control output current, i.e., flow of carriers in the channel region, of a semiconducting device, such as a field effect transistor (FET), through electrical or magnetic fields. The "channel region" is the region between the source region and the drain region of a semiconductor device that becomes conductive when the semiconductor device is turned on. The source region is a doped region in the semiconductor device, in which the majority of carriers are flowing into the channel region. The drain region is the doped region in semiconductor device located at the end of the channel region, in which the charge carriers are flowing out of the semiconductor device through the drain region.

Gate sidewall spacers, i.e., dielectric spacers, are typically formed by depositing a layer of a nitride containing material on the sidewall and upper surfaces of the gate structure, as well as the adjacent surfaces of the substrate, and removing the horizontal portions of the layer of the nitride containing material using an anisotropic etch so that the vertical portions of the nitride containing layer remain to provide the gate sidewall spacers. In some applications, regions including a high density of gate structures are present on the same substrate as regions including a low density of gate structures. Blanket deposition of layers of nitride containing material over the regions of high density gate structures result in a portion of the deposited nitride containing layer having a lesser thickness than the portion of the nitride containing layer that is present over the region of the low density gate structures.

The differential in the thickness of the deposited layer of nitride containing material in the region of high density gate structures and the region of low density gate structures results in gate sidewall spacers, i.e., dielectric spacers, having a different width on the high density gate structures in comparison to the low density gate structures. For example, the greater thickness of the nitride containing layer over the low density gate structures results in a dielectric spacer having a greater width, when compared to the lesser width of the dielectric spacers that are formed from the thinner layer of the nitride containing material that is present over the higher density of gate structures. The dielectric spacers, i.e., gate sidewall spacers, dictate the location of the source and drain regions that are implanted into the semiconductor substrate. For example, the source and drain regions that are formed adjacent to the high density of gate structures are closer to the channel region of the semiconductor devices than the source and drain regions of the semiconductor devices having the lower density of gate structures.

Because the source and drain regions to the high density gate structures are closer to the channel region than the source and drain regions to the low density gate structures, the speed of the semiconductor devices having the high density gate structures is greater than the speed of the semiconductor devices having the lower density gate structures. The difference in speed between the semiconductor devices having the high density gate structures and the low density gate structures creates timing problems in the electrical structures including the semiconductor devices having regions of high density and low density gate structures.

In one embodiment, the methods and structures of the present disclosure provide dielectric spacers adjacent to high density gate structures having a substantially similar width as the dielectric spacers that are adjacent to low density gate structures, and therefore reduce the difference in performance between the semiconductor devices having the high density gate structures and the semiconductor devices having the low density gate structures. By "substantially similar width" it is meant that the difference between the dielectric spacers that are adjacent the high density of gate structures and the dielectric spacers that are adjacent to the low density of gate structures is no greater 10% of the total spacer thickness. In some embodiments, the methods and structures of the present disclosure provide for uniform dielectric spacer width by positioning materials that increase the etch rate of the layer of the nitride containing material that provides the spacers in the regions of the substrate having the greater thickness of nitride containing material. In another embodiment, the methods and structures of the present disclosure provide for uniform dielectric spacer width by positioning materials that decrease the etch rate of the nitride containing layer that provides the spacers in the regions of the substrate having the lesser thickness of nitride containing layer.

Figure 1:
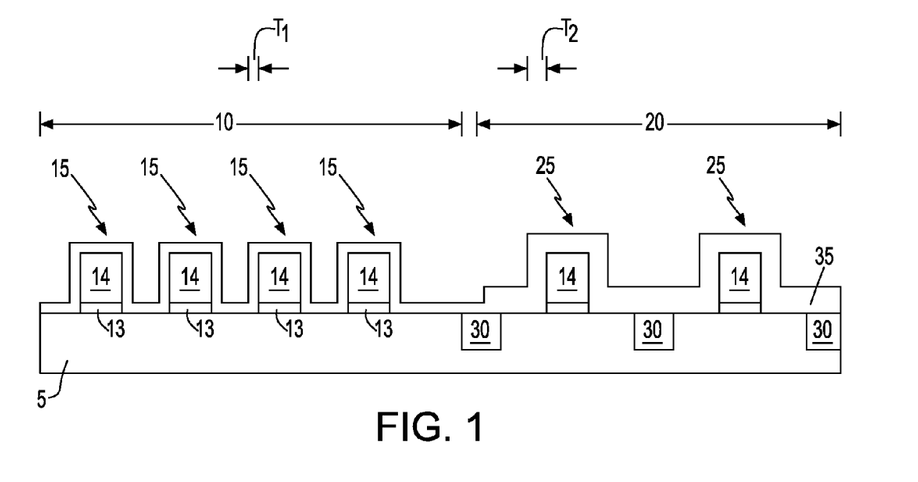
FIG. 1 is a side cross-sectional view of forming a layer of a nitride containing material over a first plurality of gate structures in a first region of a substrate and a second plurality of gate structures in a second region of the substrate, wherein the first plurality of gate structures are present in a higher density than the second plurality of gate structures, as used in accordance with the one embodiment of the present disclosure that includes at least one etch accelerating material in the second region of the substrate.

FIGS. 1 to 4 depict one embodiment of a method for forming a semiconductor device, in accordance with the present disclosure. Referring to FIG. 1, in an initial process step, a first plurality of gate structures 15 is formed in a first region 10 of a substrate 5, and a second plurality of gate structures 25 is formed in a second region 20 of the substrate 5. In one embodiment, the substrate 5 includes, but is not limited to, Si-containing materials, GaAs, InAs and other like semiconductors. Si-containing materials as used to provide the substrate 5 include, but are not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures.

Still referring to FIG. 1, the first plurality of gate structures 15 and the second plurality of gate structures 25 may be formed atop the substrate 5 utilizing deposition and lithography processes. The term "gate structure" means a structure used to control output current (i.e., flow of carriers in the channel region) of a semiconductor device, such as a field effect transistor (FET). Each gate structure in the first plurality of gate structures 15 and the second plurality of gate structures 25 may be composed of at least one gate electrode 14 and at least one gate dielectric 13. As used herein, the term "gate electrode" denotes a material having a conductivity ranging from 0.1 Ω/square to 20 Ω/square, which is positioned overlying a gate dielectric. As used herein, a "gate dielectric" is a layer of an insulator between the semiconductor device substrate and the gate electrode.

In one embodiment, the first plurality of gate structures 15 and the second plurality of gate structures 25 are provided atop the substrate 5 by depositing a gate dielectric layer followed by a gate electrode layer. In a following process step, the gate stack that is composed of the gate dielectric 13 and the gate electrode 14 is patterned using photolithography and etch processes. For example, following the deposition of the gate dielectric 13 and the gate electrode 14, an etch mask, (not shown), is formed atop the gate electrode layer protecting the portion of the gate stack that provides the first plurality of gate structures 15 and the second plurality of gate structures 25, wherein the portions exposed by the etch mask are removed by an anisotropic etch process, such as a reactive ion etch. The term "anisotropic" denotes a material removal process in which the material removal rate in the direction normal to the surface of the material to which the etching species is being applied is greater than in the direction parallel to the surface of the material to be removed. Reactive ion etching (RIE) is a form of plasma etching in which during etching the surface to be etched is exposed to reactive gases in the presence of an RF field. During RIE the surface to be etched takes on a potential that accelerates the reactive species extracted from a plasma toward the surface, in which the chemical etching reaction is taking place in the direction normal to the surface. In one embodiment, the etch mask may be provided by a patterned photoresist layer. The remaining portion of the gate dielectric layer and the gate electrode layer provide the gate dielectric 13 and the gate electrode 14 of the first plurality of gate structures 14 and the second plurality of gate structures 25.

In one embodiment, the gate structures that are present in the first region 10 of the substrate 5 are patterned and etched to provide a first density of a first plurality of gate structures 15, and the gate structures that are present in the second region 20 of the substrate 5 are patterned and etched to provide a second density of a second plurality of gate structures 25, in which the first density is greater than the second density of gate structures. The density of gate structures is the number of gate structures in an area of the substrate 5. A greater density in a first region 10 of the substrate 5 in comparison to second region 20 of the substrate 5 means that the number of gate structures for a given area in a first region 10 of the substrate 5 is greater than the number of gate structures in a second region 20 of the substrate 5. In one embodiment, the density of the gate structures is measured by the pitch. The term "pitch" means the center-to-center distance between two repeating elements of a circuit including semiconductor devices. In one embodiment, the pitch may be measured from the center of the upper surface of a first gate structure to the center of the upper surface of an adjacent gate structure. The actual dimensions for the pitch may depend upon the technology node.

The pitch for the first plurality of gate structures 15 is typically less than the pitch for the second plurality of gate structures 25. By having a lesser pitch than the second plurality of gate structures 25, the first plurality of gate structures 15 has a greater density of gate structures than the second plurality of gate structures 25. In one example, the pitch for the first plurality of gate structures 15 ranges from 50 nm to 500 nm. In another example, the pitch for the first plurality of gate structures 15 ranges from 50 nm to 250 nm. In one example, the pitch for the second plurality of gate structures 35 ranges from 100 nm to 1000 nm. In another example, the pitch for the second plurality of gate structures 35 ranges from 100 nm to 500 nm.

Each gate structure in the first plurality of gate structures 15 and the second plurality of gate structures 25 may have a gate length ranging from 5 nm to 100 nm. More typically, the length of each gate structure in the first plurality of gate structures 15 and the second plurality of gate structures 25 ranges from 10 nm to 500 nm.

The gate dielectric 13 of the first and second plurality of gate structures 15, 25 may be composed of an oxide material. Suitable examples of oxides that can be employed as the gate dielectric 15 include, but are not limited to, $SiO_2$, $Al_2O_3$, $ZrO_2$, $HfO_2$, $Ta_2O_5$, $TiO_2$, perovskite-type oxides and combinations and multi-layers thereof. The gate dielectric 13 may also be composed of a nitride, oxynitride, or a combination (or multi layer) of oxide, nitride and oxynitride. In one embodiment, the gate dielectric 13 has a thickness greater than approximately 0.8 nm. More typically, the gate dielectric 13 has a thickness ranging from 1.0 nm to 6.0 nm. The gate dielectric 13 may be formed using chemical vapor deposition (CVD) including, but not limited to; atomic layer CVD (AL-CVD), pulsed CVD, plasma assisted CVD. In another embodiment, the gate dielectric 13 is formed by a thermal growing process, which may include oxidation, oxynitridation, nitridation, and/or plasma or radical treatment.

The gate dielectric 13 may also be a high-k gate dielectric. As used herein, "high-k" denotes a dielectric material featuring a dielectric constant (k) higher than about 3.9. In one embodiment, the gate dielectric 13 is a high-k gate dielectric comprised of an insulating material having a dielectric constant greater than 7.0. Examples of high-k gate dielectrics include $HfO_2$, hafnium silicate, hafnium silicon oxynitride or combinations thereof. It is noted that other materials and thicknesses are contemplated for the gate dielectric 13, and are within the scope of the present disclosure.

The gate electrode 14 of the first and second plurality of gate structures 15, 25 may be composed of a silicon containing material, which may be polysilicon. In another embodiment, the gate electrode 14 is composed of single crystal Si, SiGe, SiGeC or combinations thereof. In another embodiment, the gate electrode 14 may be a metal. In one embodiment, the gate electrode 14 is formed atop the gate dielectric 13 utilizing a deposition process, such as CVD and/or physical vapor deposition (PVD).

In the embodiment depicted in FIG. 1, the second region 20 of the substrate 5 further includes at least one etch accelerating material 30. The at least one etch accelerating material 30 may be an oxide containing material or a carbon containing material. In one embodiment, the at least one etch accelerating material 30 is present in a trench that is formed in the substrate 5. In the embodiments, in which the at least one etch accelerating material 30 is formed in a trench, the at least one etch accelerating material 30 may be formed in the second region 20 of the substrate 5 prior to forming the second plurality of gate structures 15, 25. The trench may be formed using pattern and etch processes. In one embodiment, a pattern is produced by applying a photoresist to the surface to be etched, i.e., substrate 5; exposing the photoresist to a pattern of radiation; and then developing the pattern into the photoresist utilizing resist developer. Once the patterning of the photoresist is completed, the sections covered by the photoresist are protected while the exposed regions are removed using a selective etching process that removes the unprotected regions. As used herein, the term "selective" in reference to the material removal processes denotes that the rate of material removal for a first material is greater than the rate of at least another material of the structure to which the material removal process is being applied. In one embodiment, the exposed portions of the substrate 5 that are etched to provide the trench for the at least one etch accelerating material 30 may be positioned within the substrate 5 to be present on opposing sides of each of the gate structures of the second plurality of gate structures 25.

The exposed portion of the substrate 5 that is not protected by the patterned photoresist layer is then etched to provide the trenches for the at least one etch accelerating material 30. The etch process that forms the trenches for the at least one etch accelerating material 30 may be an anisotropic etch, such as a reactive ion etch. Other anisotropic etch processes that are suitable for forming the trench include ion beam etching, plasma etching or laser ablation. The trench containing the at least one etch accelerating material 30 may have a depth that ranges from 50 nm to 500 nm. In another embodiment, the trench containing the at least one etch accelerating material 30 may have a depth that ranges from 100 nm to 300 nm.

The trench may then be filled with the at least one etch accelerating material 30 using a deposition process, such as chemical vapor deposition. Chemical vapor deposition (CVD) is a deposition process in which a deposited species is formed as a result of chemical reaction between gaseous reactants at greater than room temperature (25° C. to 900° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the at least one etch accelerating material 30 may also be formed using spinning from solution, spraying from solution, and evaporation. The volume of the at least one etch accelerating material 30 contained within the trench ranges from 10% to 100% of the total volume of the trench. In another embodiment, the volume of the at least one etch accelerating material 30 that is contained within the trench ranges from 50% to 100% of the total volume of the trench.

In one embodiment, the at least one etch accelerating material 30 is provided by an oxide containing material. In one embodiment, the at least one etch accelerating material 30 is a fluorine doped silicon oxide or silicon dioxide. Other oxide containing materials that are suitable for the at least one etch accelerating material 30 include B-doped $SiO_2$ (boron doped silicon dioxide), P-doped $SiO_2$ (phosphorus doped silicon dioxide), C-doped $SiO_2$ (carbon doped silicon dioxide), and combinations thereof. In one embodiment, the fluorine doped silicon oxide is deposited using plasma-enhanced chemical vapor deposition (PE-CVD) with an addition of a fluorine-containing precursor, such as hexafluoroethane ($C_2F_6$), to a Si-containing precursor, such as tetraethoxysilane (TEOS). In one embodiment, the fluorine content of the silicon oxide ranges from 1 at. % to 10 at. %, the silicon content ranges from 20 at. % to 50 at. %, and the oxygen content ranges from 80 at % to 50 at. %. In another embodiment, the fluorine content of the silicon oxide ranges from 1 at. % to 5 at. %, the silicon content ranges from 30 at. % to 35 at. % and the oxygen content ranges from 65 at % to 70 at. %.

In another embodiment, the at least one etch accelerating material 30 is provided by a carbon containing material. In one embodiment, the at least one etch accelerating material 30 is a silicon carbide. Other carbon containing materials that are suitable for the at least one etch accelerating material 30 include C-doped $SiO_2$ (carbon doped silicon dioxide) and silicon carbide in combination with C-doped $SiO_2$ (carbon doped silicon dioxide). Silicon carbide may be formed within the trench using chemical vapor deposition (CVD) and carbosilane precursors. For example, silicon carbide may be deposited by low pressure chemical vapor deposition (LPCVD) using a volatile, heterocyclic, carbosilane precursor, $MeHSiCH_2\ SiCH_2Me(CH_2SiMeH_2)$ at deposition temperatures between 700° C. and 8000° C. Silicon carbide may also be formed using plasma enhanced chemical vapor deposition (PECVD) from two organosilicon precursors, silacyclobutane ($H_2CH_2SiCH_2CH_2$ or SCB) and methylsilane ($CH_3SiH_3$). In this embodiment, a capacitively coupled, parallel plate PECVD system may deposit silicon carbide at a deposition temperature of 250° C. and a deposition pressure of 2.0 Torr.

In one embodiment, the carbon content of the silicon carbide ranges from 30 at. % to 60 at. %, and the silicon content ranges from 70 at. % to 40 at. %. In another embodiment, the carbon content of the silicon carbide ranges from 40 at. % to 60 at. %, and the silicon content ranges from 60 at. % to 40 at. %. The carbon containing material may also be provided by ion implanting carbon into a silicon containing material, such as single crystal silicon, polysilicon, silicon germanium and combinations thereof. In this embodiment, the carbon content may range from 10 at. % to 30 at. %.

Referring to FIG. 1, in some examples, following filling of the trench with the at least one etch accelerating material 30, a planarization process provides an upper surface of the at least one etch accelerating material 30 that is coplanar with an upper surface of the substrate 5. "Planarization" is a material removal process that employs at least mechanical forces, such as frictional media, to produce a planar surface. In one embodiment, the planarization process includes chemical mechanical polishing (CMP) or grinding. Chemical mechanical planarization (CMP) is a material removal process using both chemical reactions and mechanical forces to remove material and planarize a surface.

Still referring to FIG. 1, a layer of a nitride containing material 35 is formed over the first plurality of gate structures 15 in the first region 10 of the substrate 5 and over the second plurality of gate structures 25. Referring to FIG. 1, the layer of the nitride containing material 35 may also be formed over the at least one etch accelerating material 30 in the second region 20 of the substrate 5. The layer of the nitride containing material 35 may be composed of any nitride containing material including silicon nitride, silicon oxynitride or a combination thereof.

Referring to FIG. 1, and in one embodiment, the layer of the nitride containing material 35 may be deposited by chemical vapor deposition (CVD) or atomic layer deposition (ALD). Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The layer of the nitride containing material 35 has a first thickness T1 over the first region 10 of the substrate 5 that is less than a second thickness T2 of the layer of the nitride containing material 35 that is present in the second region 20 of the substrate 5. The thickness of the nitride containing material 35 is less in the areas of the substrate 5 having a higher density of gate structures in comparison to the regions of the substrate 5 having the lesser density of gate structures, because the deposition reactants are depleted faster in regions of the substrate 5 having the higher surface area (high pattern density) resulting in a thinner deposition when compared to regions of the substrate 5 having a low surface area.

In one embodiment, in which the gate structures have a width ranging from 10 nm to 50 nm, each of the first plurality of gate structures 15 are separated by a space ranging from 100 nm to 200 nm, and each of the second plurality of gate structures 25 are separated by a space ranging from 200 nm to 400 nm, the first thickness T1 of the layer of the nitride containing material 35 having a thickness that is 50% to 100% of that of the second thickness T2 of the nitride containing material 35. In another embodiment, in which the gate structures have a width ranging from 10 nm to 50 nm, each of the first plurality of gate structures 15 are separated by a space ranging from 100 nm to 200 nm, and each of the second plurality of gate structures 25 are separated by a space ranging from 200 nm to 400 nm, the first thickness T1 of the layer of the nitride containing material 35 having a thickness that is 50% to 90% of that of the second thickness T2 of the nitride containing material 35. In an even further embodiment, in which the gate structures have a width ranging from 10 nm to 50 nm, each of the first plurality of gate structures 15 are separated by a space ranging from 100 nm to 200 nm, and each of the second plurality of gate structures 25 are separated by a space ranging from 200 nm to 400 nm, the first thickness T1 of the layer of the nitride containing material 35 having a thickness that is 70% to 90% of that of the second thickness T2 of the nitride containing material 35

The above-mentioned first and second thicknesses T1, T2 are measured from the sidewall of each gate structure in the first plurality and second plurality of gate structures 15, 25.

The layer of the nitride containing material 35 is present on the sidewall surfaces and the upper surface of the gates structures of the first plurality of gate structures 15 and the second plurality of gate structures 25, and is present on the upper surface of the portions of the substrate 5 that are separating the adjacent gate structures. The layer of the nitride containing material 35 is also present over the at least one etch accelerating material 30 that is depicted in FIG. 1. Although there is a difference in thickness in the layer of the nitride containing material 35 when comparing the portion of the layer of the nitride containing material 35 that is present in the first region 10 of the substrate 5 to the portion of the layer of the nitride containing material 35 that is present in the second region 20 of the substrate 5, the thickness of the layer of the nitride containing material 35 within each of the first region and the second region 10, 20 of the substrate 5 is substantially conformal. The term "conformal layer" and "conformally deposited layer" denotes a layer having a thickness that does not deviate from greater than or less than 20% of an average value for the thickness of the layer, i.e., average value of the thickness of the layer in the first region or the second region 10, 20 of the substrate 5. Therefore, in some embodiments, the thickness of the layer of the nitride containing material 35 on the substrate 5 as measured in the vertical direction from the upper surface of the substrate 5 is substantially similar to the thickness T1, T2 of the layer of the nitride containing material 35 on the sidewalls of the gate structure, as measured in the horizontal direction from the sidewall surface of the gate structure.

Figure 2:
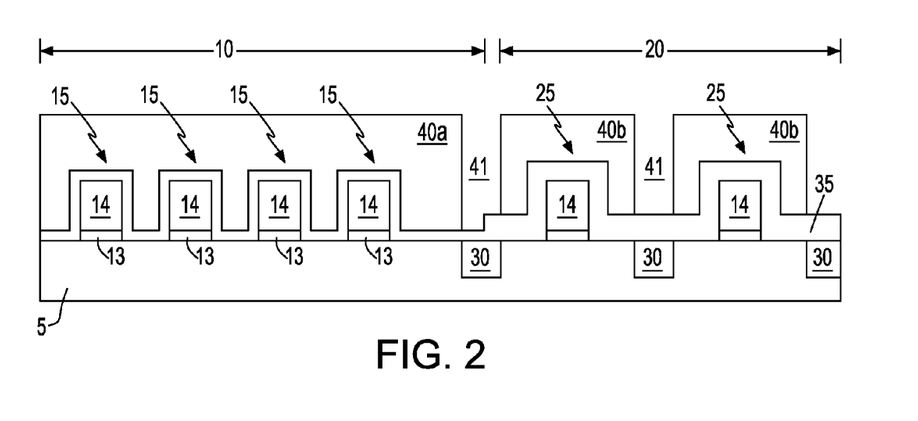
FIG. 2 is a side cross-sectional view depicting forming an etch mask overlying the layer of the nitride containing material depicted in FIG. 1, the etch mask comprising openings to a portion of the layer of the nitride containing material that is present overlying that at least one etch accelerating material, in accordance with one embodiment of the present disclosure.

FIG. 2 depicts one embodiment of forming an etch mask 40a, 40b overlying the layer of the nitride containing material 35, the etch mask 40a, 40b comprising openings 41 to a portion of the layer of the nitride containing material 35 that is present overlying the at least one etch accelerating material 30. The first portion of the etch mask 40a is present over the entirety of the first region 10 of the substrate 5. The second portion of the etch mask 40b is present over the second region 20 of the substrate 5 and includes openings 41 that expose a portion of the layer of the nitride containing material 35 that is present overlying the at least one etch accelerating material 30.

In one embodiment, the etch mask 40a, 40b is formed using deposition and photolithography processes. For example, a layer of photoresist material may be applied atop the substrate 5 including the first plurality and second plurality of gates structures 15, 25 and the at least one etch accelerating material 30 using spin coating or a similar processes. The photoresist material may be composed of dielectrics including carbon, oxygen, and various inorganic materials. Following application of the photoresist layer, the photoresist is softbaked, where the solvents of the photoresist layer are evaporated via heating. The layer of photoresist is then patterned using photolithography. Specifically, in one embodiment, a pattern is formed using a reticle and transferred into the surface of the photoresist layer. Light is passed through the opaque pattern of the reticle, which in turn produces a patterned image on the layer of photoresist. The photoresist layer is a light or radiation sensitive material and exposure to light causes changes in the photoresist structure. For example, exposure to light may change the exposed portions of the photoresist from a soluble condition to an insoluble one. Following exposure, the pattern is developed utilizing resist developer, such as a chemical solvent. The developer leaves a hole in the photoresist layer that corresponds to the opaque pattern of the reticle. Development of the pattern is conducted using development techniques including, but not limited to, continuous spray development and puddle development. An alternative resist strategy, commonly referred to as a negative resist, leaves a pattern in the resist opposite to that on the mask. The width of the openings 14 in the etch mask 40a, 40b may range from 100 nm to 1000 nm. In another embodiment, the width of the openings 14 in the etch mask 40a, 40b may range from 100 nm to 500 nm.

Figure 3:
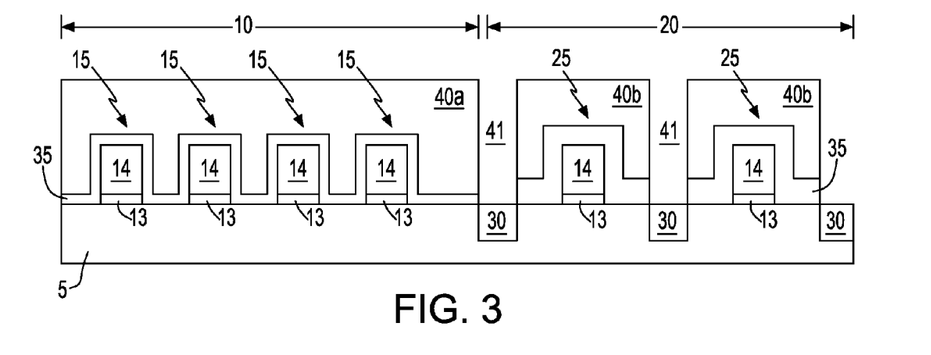
FIG. 3 is a side cross-sectional view depicting one embodiment of etching the exposed portion of the layer of the nitride containing material that is depicted in FIG. 2 stopping on the at least one etch accelerating material, in accordance with the present disclosure.

FIG. 3 depicts one embodiment of etching the exposed portion of the layer of the nitride containing material 35 stopping on the at least one etch accelerating material 30. By "stopping on" it is meant that the etch terminates on the layer of the nitride containing material 35 so that the nitride containing material 35 is exposed at the base of the openings 41 in the etch mask 40b. In one embodiment, a selective etch process removes the exposed portion of the layer of the nitride containing material 35 stopping on the at least one etch accelerating material 30. The etch process that removes the exposed portion of the layer of the nitride containing material 35 may have a selectivity that is greater than 10:1 to the at least one etch accelerating material 30. In another embodiment, the etch process that removes the exposed portion of the layer of the nitride containing material 35 may have a selectivity that is greater than 100:1 to the at least one etch accelerating material 30. In yet another embodiment, the etch process that removes the exposed portion of the layer of the nitride containing material 35 may have a selectivity that is greater than 1000:1 to the at least one etch accelerating material 30.

In one embodiment, the etch that removes the exposed portion of the layer of the nitride containing material 35 is an anisotropic etch. Examples of anisotropic etch processes for removing the exposed portion of the layer of the nitride containing material 35 include reactive ion etching, ion beam etching, plasma etching or laser ablation.

In one example, in which the layer of the nitride containing material 35 is composed of silicon nitride, and the at least one etch accelerating material 30 is composed of an oxide containing material, such as fluorinated silicon oxide or silicon dioxide, the etch chemistry for removing the exposed portion of the layer of the nitride containing material 35 is a fluorocarbon chemistry, such as $CF_4$, $C_4F_8$, $C_2F_6$, etc., with additives such as $O_2$, $N_2$, CO, Ar, and $H_2$. In one embodiment, the etching of the exposed portion of the layer of the nitride containing material 35 stopping on the oxide-containing surface comprises a $O_2/CF_4$ ratio greater than 0.15 and containing greater than 5% $N_2$, and comprises a $CF_4$ flow of 250 sccm to 400 sccm. The etching of the exposed portion of the layer of the nitride containing material 35 stopping on the oxide-containing surface comprises a microwave power ranging from 350 watt to 450 watts, and comprises a pressure ranging from 400 mTorr to 600 mTorr.

In another example, in which the layer of the nitride containing material 35 is composed of silicon nitride, and the at least one etch accelerating material 30 is composed of a carbon containing material, such as silicon carbide, the etch chemistry for removing the exposed portion of the layer of the nitride containing material 35 is a fluorocarbon chemistry, such as $CF_4$, $C_4F_8$, $C_2F_6$, etc., with additives such as $O_2$, $N_2$, CO, Ar and $H_2$.

In one embodiment, after removing the exposed portion of the layer of the nitride containing material 35, the etch mask 40a, 40b may be removed from the substrate 5. The etch mask 40a, 40b may be removed using selective etching, a chemical strip or oxygen ashing.

Figure 4:
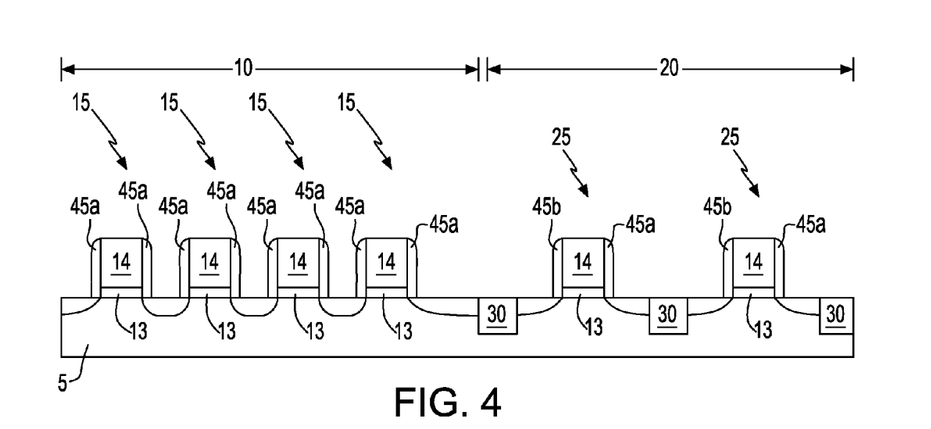
FIG. 4 is a side cross-sectional view depicting forming dielectric spacers from a remaining portion of the layer of the nitride containing material on the first plurality of gate structures and the second plurality of gate structures, wherein the at least one etch accelerating material increases etch rate of the layer of the nitride containing material in the second region of the substrate so that the thickness of the dielectric spacers in the first region of the substrate is substantially equal to the thickness of the dielectric spacers in the second region of the substrate, in accordance with one embodiment of the present disclosure.

FIG. 4 depicts one embodiment of forming dielectric spacers 45a, 45b from a remaining portion of the layer of the nitride containing material 35 on the first plurality of gate structures 15, and the second plurality of gate structures 25. In one embodiment, the dielectric spacers 45a that are present on the first plurality of gate structures 15 have the same width as the dielectric spacers 45b that are present on the second plurality of gate structures 25. Despite being formed from the portions of the layer of the nitride containing material 35 that have different thicknesses, the dielectric spacers 45a, 45b that are present on the first and second plurality of gate structures 15, 25 have substantially the same width, because the second region 20 of the substrate 5 that includes the second plurality of gate structures 25 also includes the at least one etch accelerating material 30. The at least one etch accelerating material 30 increases the etch rate of the etch process that forms the dielectric spacers 45 from the remaining portion of the layer of nitride containing material 35 in the region of the substrate 5 in which the at least one etch accelerating material 30 is present, i.e., the second region 20 of the substrate 5 containing the second plurality of gate structures 25.

For example, in one embodiment, in which the at least one etch accelerating material 30 is an oxide containing material, such as fluorinated silicon oxide, the etch rate for removing the layer of the nitride containing material 35 in the second region 20 of the substrate 5 containing the at least one etch accelerating material 30 of fluorinated silicon oxide is 1% to 30% greater than the etch rate for removing the layer of the nitride containing material 35 that is present in the first region 10 of the substrate 5, in which the same etch chemistry, e.g., fluorocarbon etch chemistry, is employed simultaneously to the first region 10 and the second region 20 of the substrate 5. By "simultaneously" it is meant that the same etch process, e.g., same etch chemistry, is applied to the layer of the nitride containing material 35 in the first region 10 of the substrate 5 at the same time that the etch process is being applied to the layer of the nitride containing material 35 in the second region 20 of the substrate 5. The etch rate in the region of the substrate 5 including the at least one etch accelerating material 30 is accelerated, because the exposed portion of the at least on etch accelerating material 30 alters the local chemistry of the etch by increasing the oxygen concentration in the plasma, thereby increasing the silicon nitride etch rate.

In another example, when the at least one etch accelerating material 30 is silicon dioxide, and the etch chemistry that is employed to etch the layer of the nitride containing material 35 is a fluorocarbon etch chemistry, the etch rate for removing the layer of the nitride containing material 35 in the second region 20 of the substrate 5 containing the silicon dioxide is 1% to 30% greater than the etch rate for removing the layer of the nitride containing material 35 that is present in the first region 10 of the substrate 5, in which the same etch chemistry, e.g., fluorocarbon etch chemistry, is employed simultaneously to the first region 10 and the second region 20 of the substrate 5.

In the embodiments in which the at least one etch accelerating material 30 is composed of an oxide containing material, such as fluorinated silicon oxide or silicon dioxide, and the nitride containing material 35 is composed of silicon nitride, the etch chemistry for forming the dielectric spacers 45a, 45b from the remaining portion of the layer of the nitride containing material 35 on the first plurality of gate structures 15, and the second plurality of gate structures 25 is a fluorocarbon chemistry, such as $CF_4$, $C_4F_8$, $C_2F_6$, etc., with additives such as $O_2$, $N_2$, CO, Ar, and $H_2$. In one example, the etching of the remaining portion of the layer of the nitride containing material 35 to form the dielectric spacers 45a, 45b comprises a $O_2/CF_4$ ratio greater than 0.15 and contains greater than 5% $N_2$, and comprises a $CF_4$ flow of 250 sccm to 400 sccm. The etching of the remaining portion of the layer of the nitride containing material 35 may include a microwave power ranging from 350 watt to 450 watts, and may comprise a pressure ranging from 400 mTorr to 600 mTorr.

In another embodiment, when the at least one etch accelerating material 30 is a carbon containing material, such as silicon carbide, and the etch chemistry employed to etch the layer of the nitride containing material 35, e.g., silicon nitride layer, is a fluorocarbon etch chemistry, the introduction of the carbon containing material typically increases the etch rate within the range of 1% to 30%. More specifically, in one example, in which the at least one etch accelerating material 30 is an carbon containing material, such as silicon carbide, the etch rate for removing the layer of the nitride containing material 35 in the second region 20 of the substrate 5 containing the at least one etch accelerating material 30 of silicon carbide is 1% to 30% greater than the etch rate for removing the layer of the nitride containing material 35 that is present in the first region 10 of the substrate 5, in which the same etch chemistry is employed simultaneously to the first region 10 and the second region 20 of the substrate 5.

In the embodiments in which the layer of the nitride containing material 35 is composed of silicon nitride, and the at least one etch accelerating material 30 is composed of a carbon containing material, such as silicon carbide, the etch chemistry for forming the dielectric spacers 45a, 45b from the remaining portion of the layer of the nitride containing material 35 on the first plurality of gate structures 15, and the second plurality of gate structures 25 is a fluorocarbon chemistry, such as $CF_4$, $C_4F_8$, $C_2F_6$, etc., with additives such as $O_2$, $N_2$, CO, Ar and $H_2$. In one embodiment, the etch composed of the fluorocarbon chemistry further includes a microwave power ranging from 350 watt to 450 watts, and may include a pressure ranging from 400 mTorr to 600 mTorr. In one example, the etching of the remaining portion of the layer of the nitride containing material 35 to form the dielectric spacers 45a, 45b comprises a $O_2/CF_4$ ratio greater than 0.15 and contains greater than 5% $N_2$, and comprises a $CF_4$ flow of 250 sccm to 400 sccm.

Still referring to FIG. 4, in a following process step, source and drain regions 50 are formed in substrate 5 on adjacent sides of each gate structure of the first and second plurality of gates structures 15, 25. The source and drain regions 50 that are formed during this stage of the present disclosure may be referred to as extension regions. In one embodiment, source and drain regions 50 are formed via ion implantation and comprise a combination of normally incident and angled implants to form the desired grading. In one embodiment, PFET devices are produced within Si-containing substrates by doping the source and drain regions 50 with elements from group III of the Periodic Table of Elements. In another embodiment, NFET devices are produced within Si-containing substrates by doping the source and drain regions 50 with elements from group V-A of the Periodic Table of Elements.

While the structures and methods of the present disclosure have been described with respect to the preferred embodiments thereof, it will be understood by those skilled in the art that the foregoing and other changes in forms of details may be made without departing from the spirit and scope of the present disclosure. It is therefore intended that the present disclosure not be limited to the exact fauns and details described and illustrated, but fall within the scope of the appended claims.

What is claimed:

1. An etch method comprising:
   providing a substrate comprising a first region having a first plurality of gate structures and a second region having a second plurality of gate structures and at least one oxide containing material, wherein the at least one oxide containing material is not present in the first region of the substrate, the first plurality of gate structures in the first region being present in a greater density than the second plurality of gate structures in the second region of the substrate;
   depositing a layer of a nitride containing material over the first region and the second region of the substrate, wherein the layer of the nitride containing material is deposited having a first thickness over the first region that is less than a second thickness of the layer of the nitride containing material that is present in the second region of the substrate;
   forming openings through the layer of the nitride containing material to expose a portion of the at least one oxide containing material; and
   forming dielectric spacers from a remaining portion of the layer of the nitride containing material on the first plurality of gate structures and the second plurality of gate structures with a plasma etch, wherein the at least one oxide containing material introduces oxygen to in the plasma etch to increase etch rate of the nitride containing material to accelerate etching in the second region of the substrate to compensate for a difference in thickness of the first thickness of the layer of nitride containing material over the first region of the substrate and the second thickness of the layer of the nitride containing material over the second region of the substrate, so that the width of the dielectric spacers in the first region of the substrate is substantially equal to the width of the dielectric spacers in the second region of the substrate.

2. The method of claim 1, wherein the first plurality of gate structures has a pitch ranging from 100 nm to 200 nm, and the second plurality of gate structures has a pitch ranging from 200 nm to 400 nm, and a gate structure length for each of the gate structures in the first plurality of the gate structures and the second plurality of the gate structures ranges from 5 nm to 100 nm.

3. The method of claim 1, wherein the first thickness ranges from 70% to 90% the second thickness.

4. The method of claim 1, wherein the forming of the openings through the layer of the nitride containing material to expose the portion of the oxide containing material comprises:
   forming an etch mask overlying the layer of the nitride containing material, the etch mask comprising openings to a portion of the layer of the nitride containing material that is present overlying the oxide containing material;
   etching the exposed portion of the layer of the nitride containing material with the plasma etch that is selective to a surface of the at least one oxide containing material; and removing the etch mask.

5. The method of claim 4, wherein the etching of the exposed portion of the layer of the nitride containing material with the plasma etch that is selective to the surface of the at least one oxide containing material comprises a $O_2/CF_4$ ratio greater than 0.15 and containing greater than 5% $N_2$, and comprises a $CF_4$ flow of 250 sccm to 400 sccm.

6. The method of claim 4, wherein the etching of the exposed portion of the layer of the nitride containing material with the plasma etch that is selective to the surface of the at least one oxide containing material comprises a microwave power ranging from 350 watt to 450 watts, and comprises a pressure ranging from 400 mTorr to 600 mTorr.

7. The method of claim 1, wherein the at least one oxide containing material comprises fluorinated silicon oxide, B-doped $SiO_2$ (boron doped silicon dioxide), P-doped $SiO_2$ (phosphorus doped silicon dioxide), C-doped $SiO_2$ (carbon doped silicon dioxide), or combinations thereof.

8. The method of claim 1, wherein the forming of the dielectric spacers from the remaining portion of the layer of the nitride containing material on the first plurality of gate structures and the second plurality of gate structures with the plasma etch comprises an anisotropic etch step.

9. The method of claim 1, wherein the forming of the dielectric spacers from the remaining portion of the layer of the nitride containing material with the plasma etch comprises an etch having a fluorocarbon chemistry.

10. The method of claim 9, wherein the fluorocarbon chemistry comprises $CF_4$, $C_4F_8$, $C_2F_6$, or a combination thereof, wherein the etch having the fluorocarbon chemistry further comprises additives selected from the group consisting of $O_2$, $N_2$, CO, Ar, and $H_2$.

11. The method of claim 9, wherein the etch having the fluorocarbon chemistry comprises a microwave power ranging from 350 watt to 450 watts, and comprises a pressure ranging from 400 mTorr to 600 mTorr.

12. The method of claim 9, wherein an etch rate for removing the layer of the nitride containing material in the second region containing the at least one oxide containing material is 1% to 30% greater than an etch rate for removing the layer of the nitride containing material that is present in the first region.

13. The method of claim 1, wherein a difference between the thickness of the dielectric spacers in the first region of the substrate range and the thickness of the dielectric spacers in the second region of the substrate is no greater 10%.

14. A method of forming dielectric spacers comprising:
providing a substrate comprising a first region having a first plurality of gate structures and a second region having a second plurality of gate structures and at least one carbon containing material, wherein the at least one carbon containing material is not present in the first region, the first plurality of gate structures in the first region being present in a greater density than the second plurality of gate structures in the second region of the substrate;
depositing a layer of a nitride containing material over the first region and the second region of the substrate, wherein the layer of the nitride containing material is deposited having a first thickness over the first region that is less than a second thickness of the layer of the nitride containing material that is present in the second region of the substrate;
forming openings through the layer of the nitride containing material to expose a portion of the at least one carbon containing material; and
forming dielectric spacers from a remaining portion of the layer of the nitride containing material on the first plurality of gate structures and the second plurality of gate structures with a plasma etch, wherein the at least one carbon containing material accelerates nitride etch rate of the nitride containing material to accelerate etching in the second region of the substrate to compensate for a difference in thickness of the first thickness of the layer of nitride containing material over the first region of the substrate and the second thickness of the layer of the nitride containing material over the second region of the substrate so that the width of the dielectric spacers in the first region of the substrate is substantially equal to the width of the dielectric spacers in the second region of the substrate.

15. The method of claim 14, wherein the at least one carbon containing material comprises silicon carbide, C-doped $SiO_2$ (carbon doped silicon dioxide) or a combination thereof.

16. The method of claim 14, wherein the forming of the dielectric spacers from the remaining portion of the layer of the nitride containing material on the first plurality of gate structures and the second plurality of gate structures with the plasma etch comprises an anisotropic etch step.

17. The method of claim 14, wherein the forming of the dielectric spacers from the remaining portion of the layer of the nitride containing material with the plasma etch comprises an etch having a fluorocarbon chemistry.

18. The method of claim 17, wherein the fluorocarbon chemistry comprises $CF_4$, $C_4F_8$, $C_2F_6$, or a combination thereof, wherein the etch having the fluorocarbon chemistry further comprises additives selected from the group consisting of $O_2$, $N_2$, CO, Ar, and $H_2$.

19. The method of claim 17, wherein the etch having the fluorocarbon chemistry comprises a microwave power ranging from 350 watt to 450 watts, and comprises a pressure ranging from 400 mTorr to 600 mTorr.

20. The method of claim 17, wherein an etch rate for removing the layer of the nitride containing material in the second region containing the at least one oxide containing material is 1% to 30% greater than an etch rate for removing the layer of the nitride containing material that is present in the first region.

* * * * *